United States Patent
Araki et al.

(10) Patent No.: US 11,993,841 B2
(45) Date of Patent: May 28, 2024

(54) SUBSTRATE PROCESSING METHOD AND SUBSTRATE PROCESSING APPARATUS

(71) Applicant: Tokyo Electron Limited, Tokyo (JP)

(72) Inventors: Masato Araki, Nirasaki (JP); Kohichi Satoh, Nirasaki (JP); Tadahiro Ishizaka, Nirasaki (JP); Takashi Sakuma, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/996,426

(22) Filed: Aug. 18, 2020

(65) Prior Publication Data

US 2021/0054503 A1  Feb. 25, 2021

(30) Foreign Application Priority Data

Aug. 21, 2019  (JP) ................... 2019-151413

(51) Int. Cl.
 *C23C 16/40* (2006.01)
 *C23C 16/52* (2006.01)

(52) U.S. Cl.
 CPC .......... *C23C 16/405* (2013.01); *C23C 16/52* (2013.01)

(58) Field of Classification Search
 CPC . C23C 16/405; C23C 16/52; C23C 16/45523; C23C 16/16; C23C 16/45561; C23C 16/06; H01L 21/28556; H01L 21/02697
 See application file for complete search history.

(56) References Cited

U.S. PATENT DOCUMENTS

| 7,211,509 B1* | 5/2007 | Gopinath ............ C23C 16/0272 |
| | | 257/E21.17 |
| 2016/0240433 A1* | 8/2016 | Ishizaka ............ C23C 16/45561 |
| 2017/0241014 A1 | 8/2017 | Yu et al. |

FOREIGN PATENT DOCUMENTS

| JP | 2016-151025 A | 8/2016 |
| KR | 1020160100850 A | 8/2016 |

* cited by examiner

*Primary Examiner* — Michael G Miller

(74) *Attorney, Agent, or Firm* — Nath, Goldberg & Meyer; Jerald L. Meyer; Tanya E. Harkins

(57) ABSTRACT

There is provided a substrate processing method which includes placing a substrate on a stage provided inside a processing container, and forming a ruthenium film on the substrate, wherein forming the ruthenium film includes repeating a cycle including: supplying a ruthenium-containing gas and a CO gas into the processing container; and stopping the supply of the ruthenium-containing gas and the CO gas into the processing container and exhausting a gas within the processing container.

2 Claims, 10 Drawing Sheets

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-151413, filed on Aug. 21, 2019, the entire contents of which are incorporated herein by reference.

TECHNICAL FIELD

The present disclosure relates to a substrate processing method and a substrate processing apparatus.

BACKGROUND

For example, a film forming apparatus for forming a ruthenium film on a substrate is known.

Patent Document 1 discloses a film forming apparatus for forming a ruthenium film on a surface of a substrate.

PRIOR ART DOCUMENT

Patent Document

Patent Document 1: Japanese Laid-Open Patent Publication No. 2016-151025

SUMMARY

According to one aspect of the present disclosure, there is provided a substrate processing method including: placing a substrate on a stage provided inside a processing container; and forming a ruthenium film on the substrate, wherein forming the ruthenium film comprises repeating a cycle including: supplying a ruthenium-containing gas and a CO gas into the processing container; and stopping the supply of the ruthenium-containing gas and the CO gas into the processing container and exhausting a gas within the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
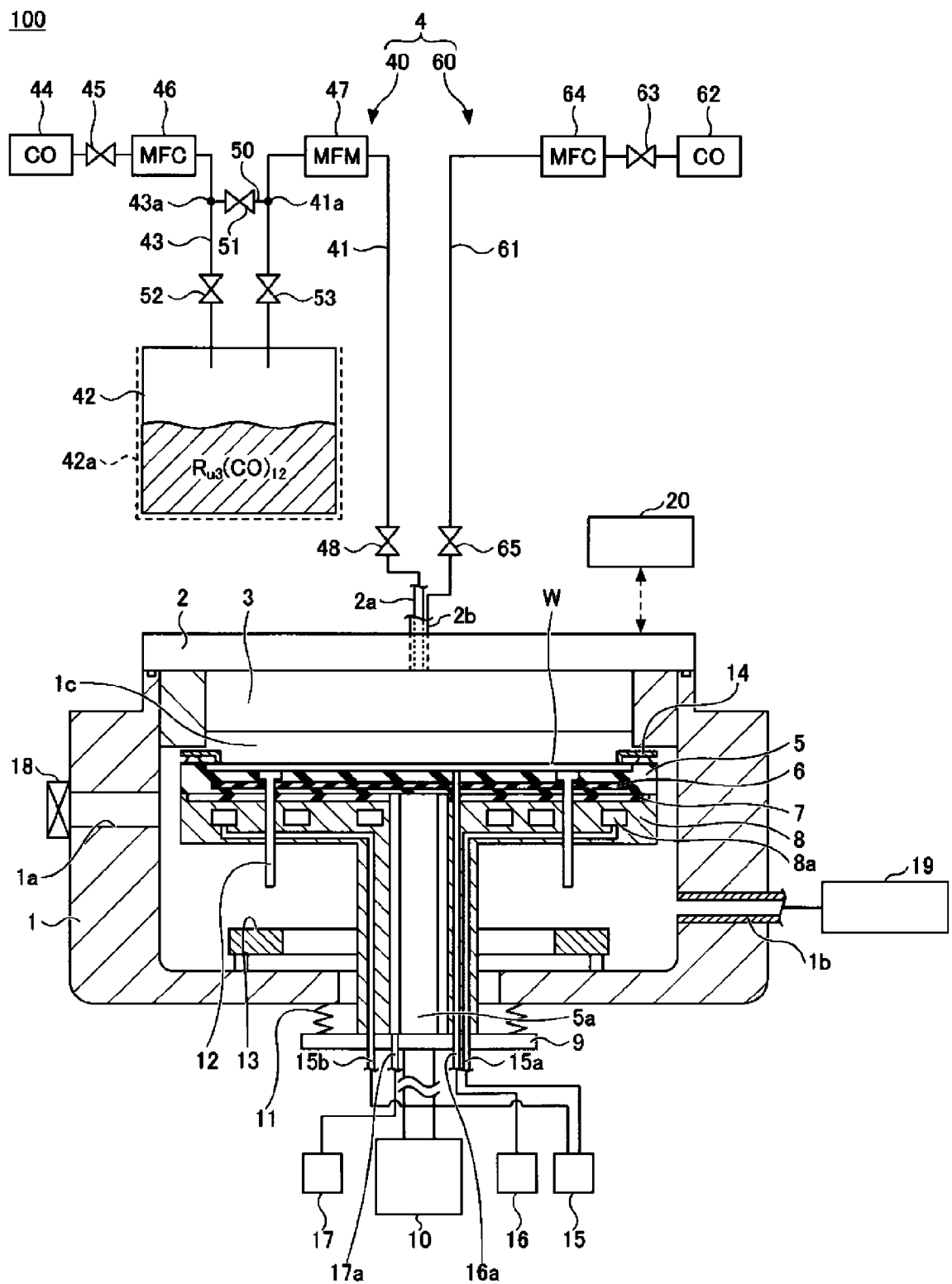
FIG. 1 is a schematic cross-sectional view of an example of a film forming apparatus according to an embodiment.

Hereinafter, some embodiments of the present disclosure will be described with reference to the accompanying drawings. In each of the drawings, the same components are denoted by the same reference numerals, and redundant descriptions thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Film Forming Apparatus>

A film forming apparatus (substrate processing apparatus) 100 according to an embodiment will be described with reference to FIG. 1. FIG. 1 is a schematic cross-sectional view showing an example of the film forming apparatus 100 according to an embodiment. The film forming apparatus 100 illustrated in FIG. 1 is an apparatus for forming a ruthenium film on a surface of a substrate W such as a wafer by supplying a process gas such as a ruthenium-containing gas to the substrate W.

A processing container 1 is a container that has a bottom and an opening at an upper side. A support member 2 supports a gas ejection mechanism 3. In addition, when the support member 2 closes the upper opening of the processing container 1, the processing container 1 is sealed to form a processing chamber 1*c*. A gas supply part 4 supplies a ruthenium-containing gas, a carrier gas, and a dilution gas to the gas ejection mechanism 3 through supply pipes 2*a* and 2*b* penetrating the support member 2. The ruthenium-containing gas, the carrier gas, and the dilution gas supplied from the gas supply part 4 are supplied from the gas ejection mechanism 3 into the processing chamber 1*c*.

The gas supply part 4 includes a ruthenium-containing gas supply part 40 and a dilution gas supply part 60.

The ruthenium-containing gas supply part 40 has a pipe 41. The pipe 41 has one end connected to a raw material tank 42 and the other end connected to the supply pipe 2*a*.

The raw material tank 42 stores $Ru_3(CO)_{12}$ which is a film-forming raw material. $Ru_3(CO)_{12}$ is solid at room temperature. The raw material tank 42 contains $Ru_3(CO)_{12}$ as a film-forming raw material as a solid. A heater 42*a* is provided around the raw material tank 42 to heat the film-forming raw material within the raw material tank 42 to an appropriate temperature so that $Ru_3(CO)_{12}$ is sublimated. The film-forming raw material is not limited to $Ru_3(CO)_{12}$. For example, η4-2,3-dimethylbutadiene ruthenium tricarbonyl (Ru(DMBD)(CO)₃), (2,4-dimethylpentadienyl)(ethylcyclopentadienyl))ruthenium(Ru(DMPD)(EtCp)), bis(2,4-dimethylpentadieneyl)ruthenium(Ru(DMPD)₂), 4-dimethylpentadienyl)(methylcyclopentadienyl)ruthenium (Ru(DMPD(MeCp)), bis(cyclopentadienyl)ruthenium(Ru (C₅H₅)₂), cis-dicarbonyl bis(5-methylhexane-2,4-dionate) ruthenium(II), or the like may be used as the film-forming raw material.

The raw material tank 42 is connected with a pipe 43 through which a CO gas as a carrier gas is supplied into the raw material tank 42. The pipe 43 extends from a carrier gas source 44, which is a source of the carrier gas, and is connected to the raw material tank 42. The pipe 43 is provided with a valve 45, a mass flow controller (MFC) 46, a branch portion 43a (to be described later), and a valve 52 (to be described later) in this order from the carrier gas source 44. The mass flow controller 46 controls a flow rate of the carrier gas flowing through the pipe 43. The valve 45 switches the supply and cutoff of the carrier gas. The carrier gas is not limited to the CO gas. For example, N₂, Ar or the like may be used as the carrier gas.

The raw material tank 42 is also connected with a pipe 41 through which the carrier gas and the ruthenium-containing gas are supplied to the processing chamber 1c. The pipe 41 is provided with a valve 53 (to be described later), a junction portion 41a (to be described later), a mass flow meter (MFM) 47, and a valve 48 in this order from the raw material tank 42. The mass flow meter 47 detects flow rates of the carrier gas and the ruthenium-containing gas to be supplied into the processing chamber 1c. The flow rate of the ruthenium-containing gas supplied to the processing chamber 1c is calculated based on a difference between the detection value of the mass flow meter 47 and the flow rate of the mass flow controller 46. The valve 48 switches the supply and cutoff of the gas to be supplied from the ruthenium-containing gas supply part 40 to the processing chamber 1c. The pipe 41 may be provided with a heater (not illustrated) for preventing the condensation of the Ru₃(CO)₁₂ gas. The Ru₃(CO)₁₂ gas sublimated in the raw material tank 42 is carried by the CO gas as a carrier gas, and is supplied into the processing chamber 1c via the pipe 41, the supply pipe 2a, and the gas ejection mechanism 3.

Further, the branch portion 43a of the pipe 43 (portion between the mass flow controller 46 and the valve 52) and the junction portion 41a of the pipe 41 (portion between the valve 53 and the mass flow meter 47) are connected to each other by a bypass pipe 50. A valve 51 is provided in the bypass pipe 50. The valve 52 is provided on the downstream side (on the side of the raw material tank 42) of the branch portion 43a in the pipe 43. The valve 53 is provided on the upstream side (on the side of the raw material tank 42) of the junction portion 41a in the pipe 41.

By closing the valves 52 and 53 and opening the valve 51, the carrier gas from the carrier gas source 44 is supplied to the pipe 41 via the pipe 43 and the bypass pipe 50 so as to purge the ruthenium-containing gas inside the pipe 41. In addition, by closing the valve 51 and opening the valves 52 and 53, the carrier gas from the carrier gas source 44 is supplied to the raw material tank 42 via the pipe 43. As a result, the ruthenium-containing gas and the carrier gas are supplied into the processing chamber 1c via the pipe 41, the supply pipe 2a, and the gas ejection mechanism 3.

The dilution gas supply part 60 has a pipe 61. The pipe 61 has one end connected to the supply pipe 2b and the other end connected to a dilution gas source 62 which is a source of a dilution gas.

The pipe 61 is provided with a valve 63, a mass flow controller (MFC) 64, and a valve 65 in this order from the dilution gas source 62. The mass flow controller 64 controls a flow rate of the dilution gas flowing through the pipe 61. The valves 63 and 65 switch the supply and cutoff of the dilution gas. The dilution gas is not limited to the CO gas. For example N₂, Ar, H₂ or the like may be used as the dilution gas.

As described above, the carrier gas carries the Ru₃(CO)₁₂ gas sublimated inside the raw material tank 42 into the processing container 1. The flow rate of the Ru₃(CO)₁₂ gas supplied from the raw material tank 42 into the processing container 1 increases or decreases depending on the flow rate of the carrier gas. That is, by adjusting the flow rate of the carrier gas, the flow rate of the Ru₃(CO)₁₂ gas supplied from the raw material tank 42 into the processing container 1 is adjusted.

In addition, the dilution gas dilutes the Ru₃(CO)₁₂ gas carried by the carrier gas. By adjusting the flow rate of the dilution gas, the concentration (partial pressure) of the Ru₃(CO)₁₂ gas in the ruthenium-containing gas supplied into the processing container 1 is adjusted. In other words, by adjusting the flow rate of the dilution gas, the flow rate of the entire gas (the Ru₃(CO)₁₂ gas, the carrier gas, and the dilution gas) supplied from the supply pipe 2a into the processing container 1 is adjusted.

For example, when the Ru₃(CO)₁₂ in the raw material tank 42 is used, the sublimation amount of Ru₃(CO)₁₂ decreases. When the sublimation amount of Ru₃(CO)₁₂ decreases, the flow rate of the carrier gas is increased. As a result, the flow rate of the Ru₃(CO)₁₂ gas supplied from the raw material tank 42 into the processing container 1 is maintained. In addition, the flow rate of the dilution gas decreases. As a result, the flow rate of the entire gas (the Ru₃(CO)₁₂ gas, the carrier gas, and the dilution gas) supplied into the processing container 1 from the supply pipe 2a is maintained.

A stage 5 is a member configured to place the substrate W thereon. A heater 6 is provided inside the stage 5 so as to heat the substrate W. The stage 5 includes a support part 5a that extends downwards from the center of a bottom surface of the stage 5. The support part 5a has one end that penetrates a bottom portion of the processing container 1 and is supported on a lifting mechanism 10 through a lifting plate 9. In addition, the stage 5 is fixed on a temperature control jacket 8, which is a temperature control member, via a heat-insulating ring 7. The temperature control jacket 8 has a plate portion that fixes the stage 5, a shaft portion that extends downward from the plate portion and is configured to cover the support part 5a, and a hole portion formed to penetrate the shaft portion from the plate portion.

The shaft portion of the temperature control jacket 8 penetrates the bottom portion of the processing container 1. A lower end portion of the temperature control jacket 8 is supported on the lifting mechanism 10 via the lifting plate 9 disposed below the processing container 1. A bellows 11 is provided between the bottom portion of the processing container 1 and the lifting plate 9. Thus, even if the vertical movement of the lifting plate 9 is performed, an airtight seal of the interior of the processing container 1 is maintained.

When the lifting mechanism 10 raises and lowers the lifting plate 9, the stage 5 is capable of being raised and lowered between a processing position (see FIG. 1) at which the substrate W is processed, and a delivery position (not illustrated) at which the substrate W is delivered between the stage 5 and an external transfer mechanism (not illustrated) through a loading/unloading port 1a.

Lifting pins 12 support the substrate W from the bottom surface of the substrate W and lift up the substrate W from a placement surface of the stage 5 when the substrate W is delivered between the stage 5 and the external transfer mechanism (not illustrated). Each of the lifting pins 12 has a shaft portion and a head portion having a diameter larger than that of the shaft portion. Through-holes are formed in the stage 5 and the plate portion of the temperature control jacket 8. The shaft portions of the lifting pins 12 are inserted into the respective through-holes. In addition, recesses are formed at the side of the placement surface of the stage 5 to accommodate the head portions of the lifting pins 12, respectively. A contact member 13 is disposed below the lifting pins 12.

In the state in which the stage 5 is moved up to the processing position of the substrate W (see FIG. 1), the head portions of the lifting pins 12 are accommodated in the respective recesses, and the substrate W is placed on the placement surface of the stage 5. In addition, the head portions of the lifting pins 12 are engaged into the respective recesses, and the shaft portions of the lifting pins 12 pass through the stage 5 and the plate portion of the temperature control jacket 8 so that the lower ends of the shaft portions of the lifting pins 12 protrude from the plate portion of the temperature control jacket 8. Meanwhile, in the state in which the stage 5 is moved to the delivery position (not illustrated) of the substrate W, the lower ends of the lifting pins 12 are brought into contact with the contact member 13 so that the head portions of the lifting pins 12 protrude from the placement surface of the stage 5. As a result, the head portions of the lifting pins 12 support the substrate W from the bottom surface of the substrate W, and lift up the substrate W from the placement surface of the stage 5.

An annular member 14 is disposed above the stage 5. In the state in which the stage 5 is moved up to the processing position of the substrate W (see FIG. 1), the annular member 14 is brought into contact with an outer peripheral portion of the upper surface of the substrate W, and the substrate W is pressed against the placement surface of the stage 5 by the weight of the annular member 14. Meanwhile, in the state in which the stage 5 is moved to the delivery position (not illustrated) of the substrate W, the annular member 14 is locked to a locking part (not illustrated) above the loading/unloading port 1a. Thus, the delivery of the substrate W by the transfer mechanism (see FIG. 1) is not hindered.

A chiller unit 15 circulates coolant (e.g., cooling water) through a flow path 8a formed in the plate portion of the temperature control jacket 8 via pipes 15a and 15b.

A heat-transfer gas supply part 16 supplies a heat-transfer gas (e.g., He gas) to a space between a rear surface of the substrate W placed on the stage 5 and the placement surface of the stage 5 through a pipe 16a.

A purge gas supply part 17 supplies a purge gas to a pipe 17a, a gap formed between the support part 5a of the stage 5 and the hole portion of the temperature control jacket 8, a flow path (not illustrated) formed between the stage 5 and the heat-insulating ring 7 to extend radially outward, and a vertical flow path (not illustrated) formed at the outer peripheral portion of the stage 5. Further, through these flow paths, the purge gas (e.g., CO gas) is supplied to a space between the bottom surface of the annular member 14 and the upper surface of the stage 5. Thus, the process gas is prevented from flowing into the space between the bottom surface of the annular member 14 and the upper surface of the stage 5, thereby preventing a film from being formed on the bottom surface of the annular member 14 or the outer peripheral portion of the upper surface of the stage 5.

The sidewall of the processing container 1 is provided with the loading/unloading port 1a for loading/unloading the substrate W therethrough and a gate valve 18 for opening/closing the loading/unloading port 1a.

An exhaust part 19 including a vacuum pump and the like is connected to the lower sidewall of the processing container 1 through an exhaust pipe 1b. The interior of the processing container 1 is evacuated by the exhaust part 19, so that the interior of the processing chamber 1c is set and maintained at a predetermined vacuum atmosphere (having a pressure of, for example, 1.33 Pa).

A controller 20 controls the operation of the film forming apparatus 100 by controlling the gas supply part 4, the heater 6, the lifting mechanism 10, the chiller unit 15, the heat-transfer gas supply part 16, the purge gas supply part 17, the gate valve 18, the exhaust part 19, and the like.

<Operation of the Film Forming Apparatus>

Figure 2:
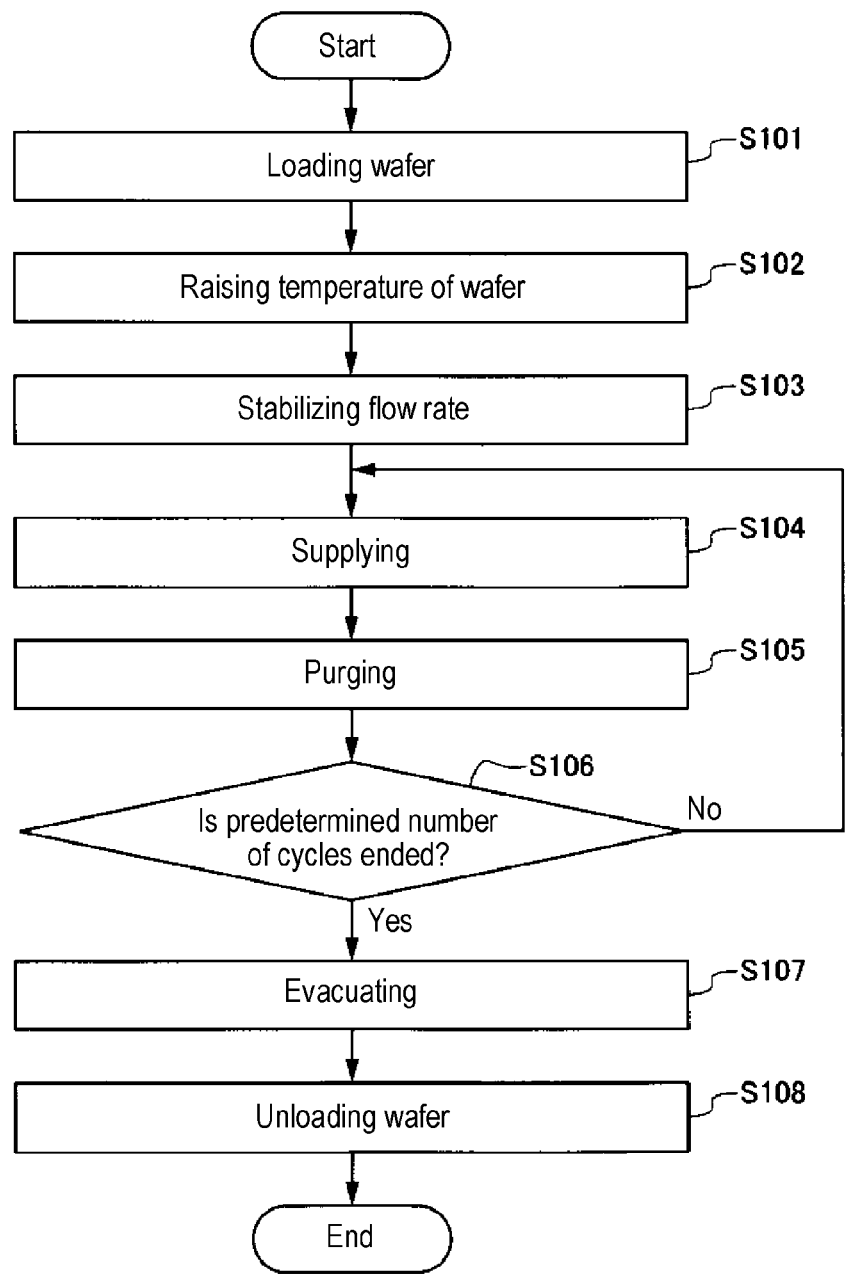
FIG. 2 is a flowchart illustrating an example of an operation of the film forming apparatus according to the embodiment.

Next, an example of the operation of the film forming apparatus 100 will be described with reference to FIG. 2. FIG. 2 is a flowchart illustrating an example of the operation of the film forming apparatus 100 according to the present embodiment. Further, at the time of starting, the interior of the processing chamber 1c becomes a vacuum atmosphere by the exhaust part 19. In addition, the stage 5 is moved to the delivery position.

In step S101, the controller 20 performs loading of the substrate W. Specifically, the controller 20 opens the gate valve 18. Here, the substrate W is placed on the lifting pins 12 by the external transfer mechanism (not illustrated). When the external transfer mechanism (not illustrated) is withdrawn from the loading/unloading port 1a, the controller 20 closes the gate valve 18. The controller 20 controls the lifting mechanism 10 to move the stage 5 to the processing position. At this time, as the stage 5 is raised, the substrate W placed on the lifting pins 12 is placed on the placement surface of the stage 5. In addition, the annular member 14 comes into contact with the outer peripheral portion of the upper surface of the substrate W, and presses the substrate W against the placement surface of the stage 5 by its own weight.

In step S102, the controller 20 operates the heater 6 to raise the temperature of the substrate W. At this time, the controller 20 controls the heat-transfer gas supply part 16 to supply the heat-transfer gas between the rear surface of the substrate W placed on the stage 5 and the placement surface of the stage 5. In addition, the controller 20 controls the purge gas supply part 17 to supply the purge gas between the bottom surface of the annular member 14 and the upper surface of the stage 5. The purge gas passes through the flow path formed at the side of the bottom surface of the annular member 14, and is exhausted by the exhaust part 19 through the exhaust pipe 1b.

In step S103, the controller 20 controls the gas supply part 4 to supply the CO gas into the processing chamber 1c of the processing container 1. Specifically, the controller 20 closes the valves 52 and 53 and opens the valves 45, 51, and 48. The carrier gas (CO gas) is supplied from the carrier gas source 44 into the processing chamber 1c of the processing container 1 through the pipe 43, the bypass pipe 50, and the pipe 41. In addition, the controller 20 controls the mass flow controller 46 while referencing the detection value of the mass flow meter 47 so as to stabilize the flow rate of the carrier gas.

In step S104, the controller 20 executes a supply process of supplying the ruthenium-containing gas and the CO gas into the processing chamber 1c. Specifically, the controller 20 closes the valve 51 and opens the valves 45, 52, 53, and 48. As the carrier gas, the CO gas is supplied from the carrier gas source 44 into the raw material tank 42 through the pipe 43. The $Ru_3(CO)_{12}$ gas sublimated inside the raw material tank 42 is carried by the CO gas, and is supplied as the ruthenium-containing gas into the processing container 1 through the pipe 41. Further, the controller 20 opens the valves 63 and 65. As the dilution gas, the CO gas is supplied from the dilution gas source 62 into the processing container 1 through the pipe 61. As a result, a predetermined process such as film formation is performed on the substrate W. After the process, the gases pass through a gap (a flow path) at the side of the upper surface of the annular member 14, and are exhausted by the exhaust part 19 through the exhaust pipe 1b. Hereinafter, in some cases, the CO gas may refer to a dilution gas, a carrier gas, or both.

In step S105, the controller 20 executes a purge process of stopping the supply of the ruthenium-containing gas and the CO gas. Specifically, the controller 20 closes the valves 48 and 65 from the state of step S104. As a result, the supply of the gases from the gas supply part 4 is stopped. In addition, the gas in the processing chamber 1c is exhausted by the exhaust part 19.

In step S106, the controller 20 determines whether or not a predetermined number of cycles is completed, with the supply process of step S104 and the purge process of step S105 as one cycle. The predetermined number of cycles is set such that, for example, the film thickness of the ruthenium film becomes a desired thickness. If it is determined that the predetermined number of cycles is not completed ("No" in S106), the process performed by the controller 20 returns to step S104. If it is determined that the predetermined number of cycles is completed ("Yes" in S106), the process performed by the controller 20 proceeds to step S107.

Figure 3:
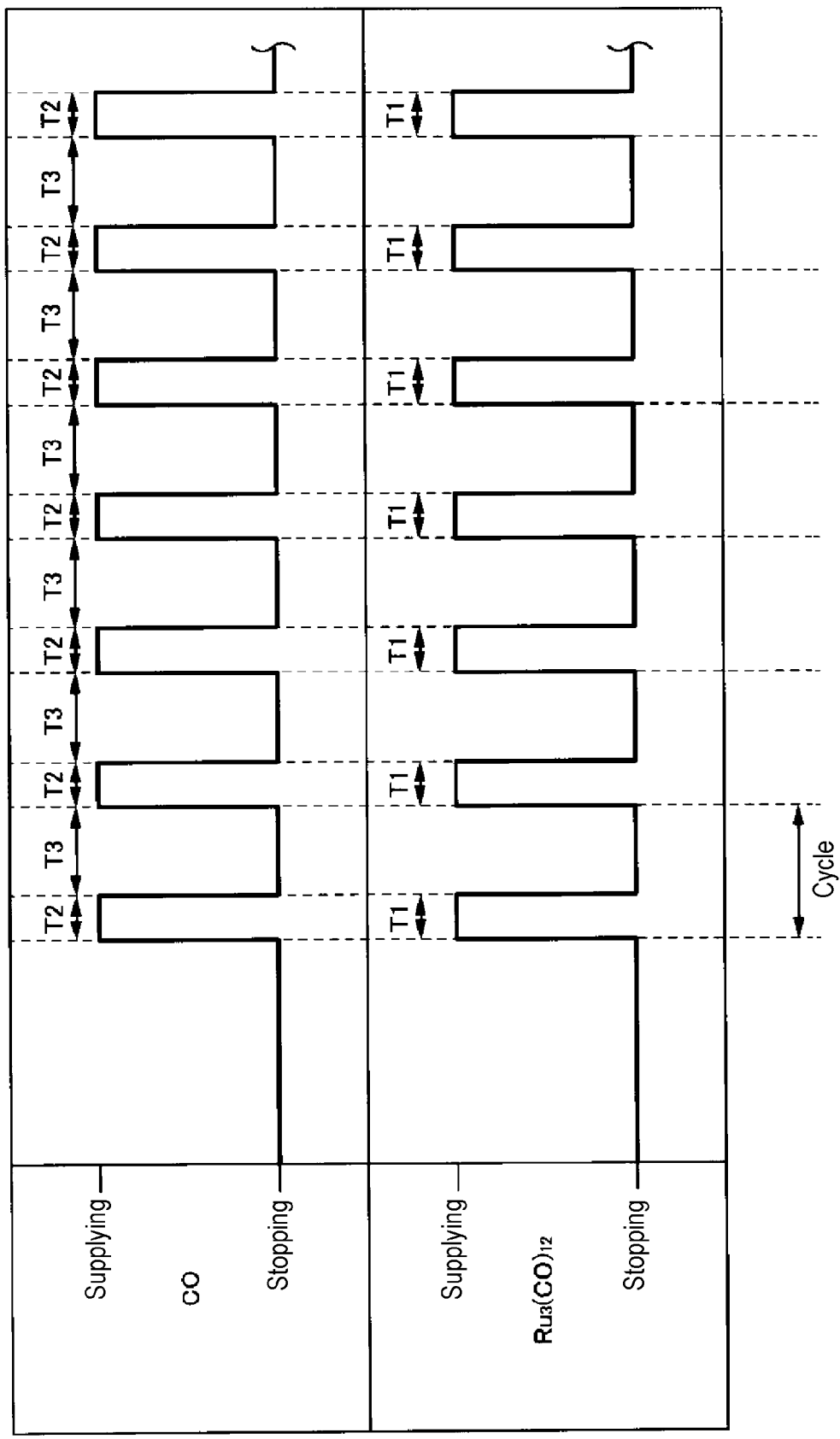
FIG. 3 is a timing chart explaining an example of the supply and cutoff of a CO gas and a ruthenium-containing gas when a supply process and a purge process are repeatedly performed.

Here, the process of the cycle including steps S104 to S106 will be further described with reference to FIG. 3. FIG. 3 is a timing chart for explaining an example of the supply and cutoff of the CO gas and the ruthenium-containing gas when the supply process and the purge process are repeatedly performed. In addition, in the example of FIG. 3, a ruthenium-containing gas supply time T1 and a CO gas supply time T2 are assumed to be equal to each other. Further, it is assumed that a start timing of the ruthenium-containing gas supply time T1 and a start timing of the CO gas supply time T2 are equal to each other, and an end timing of the ruthenium-containing gas supply time T1 and an end timing of the CO gas supply time T2 are equal to each other.

In step S104, the ruthenium-containing gas and the CO gas are supplied. By using the CO gas as a carrier gas, the decomposition reaction of $Ru_3(CO)_{12}$ can be suppressed, and the ruthenium-containing gas can be supplied into the processing container 1. Then, as expressed by the following Equation (1), the ruthenium-containing gas is thermally decomposed on the surface of the substrate W heated by the heater 6.

$$Ru_3(CO)_{12} \rightarrow 3Ru+12CO \qquad (1)$$

Further, it is considered that adsorption (ad) and desorption reactions occur on the surface of the substrate W as represented by the following Equations (2) and (3).

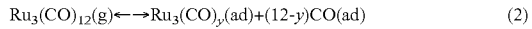

$$Ru_3(CO)_{12}(g) \leftrightarrow Ru_3(CO)_y(ad)+(12-y)CO(ad) \qquad (2)$$

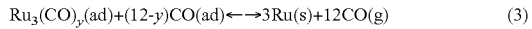

$$Ru_3(CO)_y(ad)+(12-y)CO(ad) \leftrightarrow 3Ru(s)+12CO(g) \qquad (3)$$

Here, the reactions represented by the above Equations (2) and (3) are equilibrium reactions. By exhausting the gas in the processing container 1 in the purge process illustrated in step S105, the reaction represented by Equation (2) easily proceeds to the left side in the equation, and the reaction represented by Equation (3) easily proceeds to the right side in the equation. Therefore, the growth of individual nuclei of metal ruthenium is suppressed so that a large number of small nuclei are formed. By forming a ruthenium film from the small nuclei, the growth of which is suppressed as described above, a dense ruthenium film having high smoothness can be formed.

Returning to FIG. 2, in step S107, the controller 20 evacuates the interior of the processing container 1. Specifically, the controller 20 stops the supply of the gases from the gas supply part 4 (closes the valves 48 and 65) and exhausts the gas in the processing container 1 by the exhaust part 19.

In step S108, the controller 20 performs unloading of the substrate W. Specifically, the controller 20 controls the lifting mechanism 10 to move the stage 5 from the processing position to the delivery position. At this time, as the stage 5 is lowered, the annular member 14 is locked to the locking part (not illustrated). In addition, when the lower ends of the lifting pins 12 are brought into contact with the contact member 13, the head portions of the lifting pins 12 protrude from the placement surface of the stage 5 and lift up the substrate W from the placement surface of the stage 5. Further, the controller 20 opens the gate valve 18. The substrate W placed on the lifting pins 12 is unloaded by the external transfer mechanism (not illustrated). When the external transfer mechanism (not illustrated) is withdrawn from the loading/unloading port 1a, the controller 20 closes the gate valve 18.

As described above, the film forming apparatus 100 according to the present embodiment can form the ruthenium film on the substrate W.

Although the example of FIG. 3 has been described such that the ruthenium-containing gas supply time T1 and the CO gas supply time T2 are equal to each other, the start timing of the ruthenium-containing gas supply time T1 and the start timing of the CO gas supply time T2 are equal to each other, and the end timing of the ruthenium-containing gas supply time T1 and the end timing of the CO gas supply time T2 are equal to each other, the present disclosure is not limited thereto.

Figure 4:
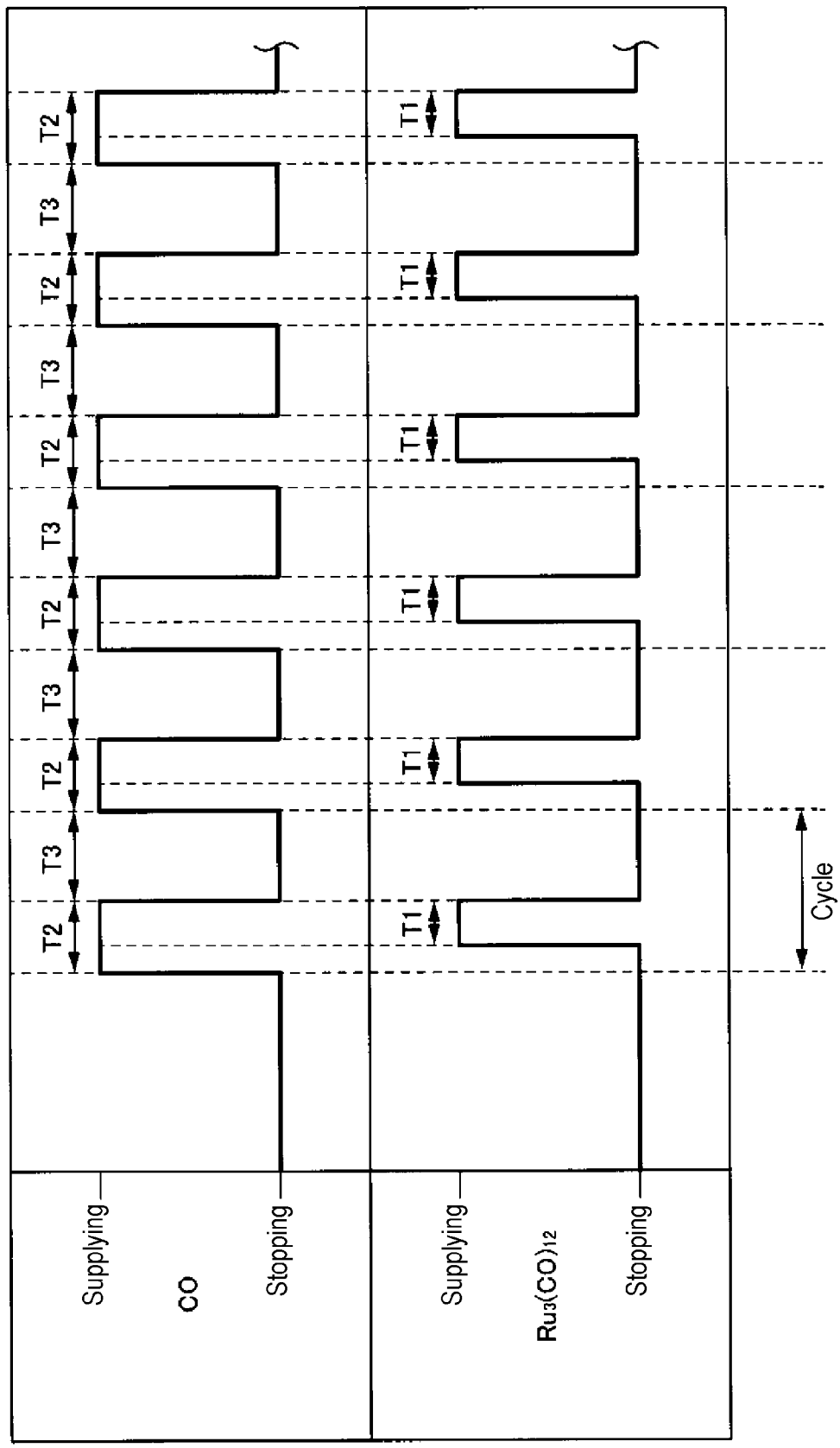
FIG. 4 is a timing chart explaining another example of the supply and cutoff of a CO gas and a ruthenium-containing gas when a supply process and a purge process are repeatedly performed.

FIG. 4 is a timing chart for explaining another example of the supply and cutoff of the CO gas and the ruthenium-containing gas when the supply process and the purge process are repeatedly performed. In the example illustrated in FIG. 4, the CO gas supply time T2 is set to be longer than the ruthenium-containing gas supply time T1. Further, the start timing of the CO gas supply time T2 is set to be earlier than the start timing of the ruthenium-containing gas supply time T1. Specifically, the valve 48 is opened after a predetermined time from the opening of the valve 65.

In some embodiments, for example, at the start timing of the CO gas supply time T2, after supplying the dilution gas and the carrier gas, the ruthenium-containing gas may be supplied by switching the valves. Specifically, the valves 52 and 53 are closed and the valves 45, 51, and 48 are opened so as to supply the CO gas from the carrier gas source 44 into the processing chamber 1c. In addition, the valves 63 and 65 are opened so as to supply the CO gas from the dilution gas source 62 into the processing chamber 1c. At the start timing of the ruthenium-containing gas supply time T1, the valves 52 and 53 are opened and the valve 51 is closed. At the end timings of the ruthenium-containing gas supply time T1 and the CO gas supply time T2, the valves 48 and 65 are closed.

By performing the control in this manner, it is possible to establish a CO gas atmosphere in the interior of the processing chamber 1c before the ruthenium-containing gas is supplied into the processing chamber 1c. Therefore, it is possible to suppress the growth of metal ruthenium nuclei on the substrate W and to form a dense ruthenium film having high smoothness.

Figure 5:
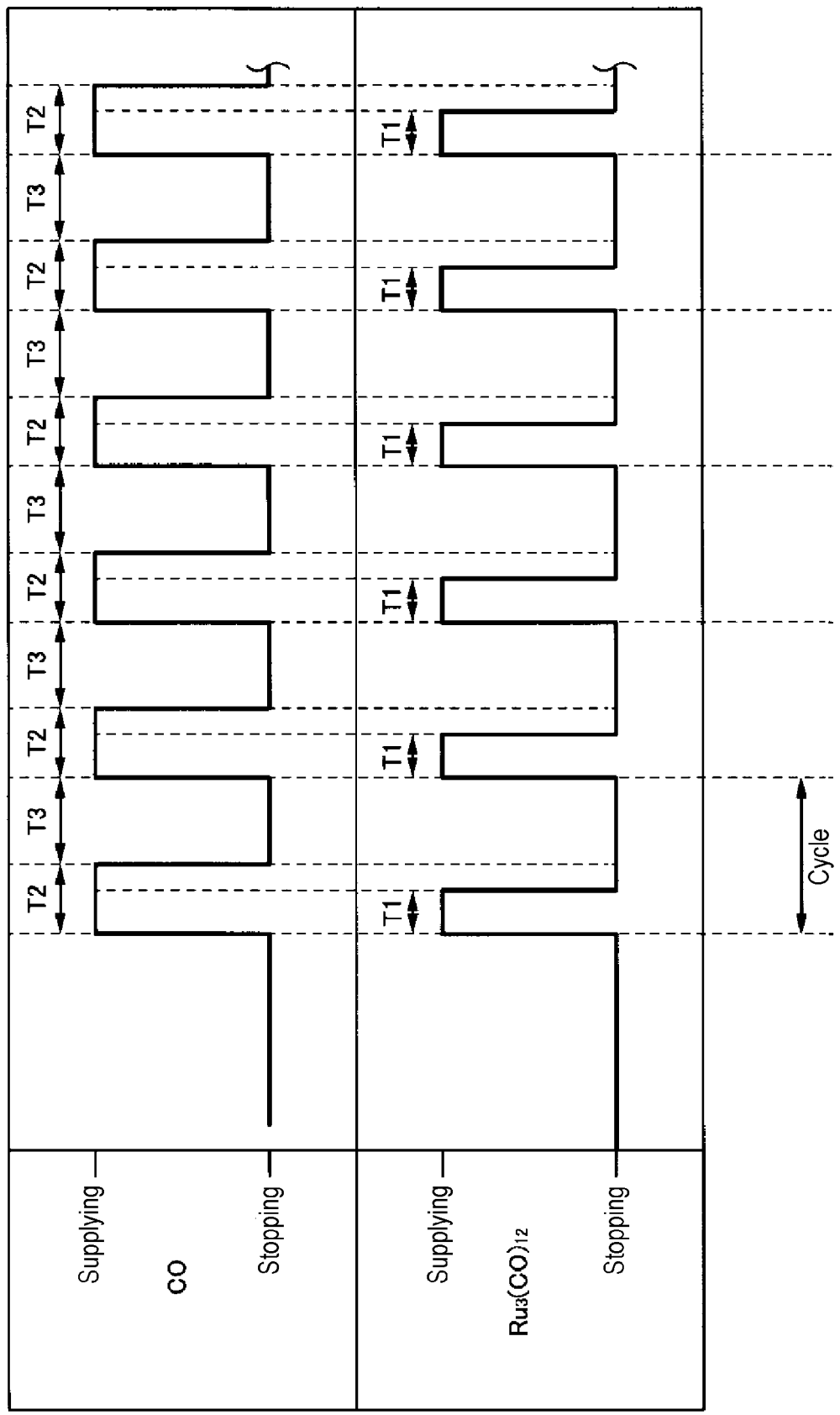
FIG. 5 is a timing chart explaining yet another example of the supply and cutoff of a CO gas and a ruthenium-containing gas when a supply process and a purge process are repeatedly performed.

FIG. 5 is a timing chart explaining yet another example of the supply and cutoff of the CO gas and the ruthenium-containing gas when the supply process and the purge process are repeatedly performed. In the example illustrated in FIG. 5, the CO gas supply time T2 is set to be longer than the ruthenium-containing gas supply time T1. Further, the end timing of the CO gas supply time T2 is set to be later than the end timing of the ruthenium-containing gas supply time T1. Specifically, the valve 65 is closed after a predetermined time from the closing of the valve 48.

Further, for example, at the start timings of the ruthenium-containing gas supply time T1 and the CO gas supply time T2, the valve 51 is closed and the valves 45, 52, 53, and 48 are opened to supply the ruthenium-containing gas into the processing chamber 1c together with the CO gas which is a carrier gas. In addition, the valves 63 and 65 are opened so as to supply the CO gas from the dilution gas source 62 into the processing chamber 1c.

In some embodiments, at the end timing of the ruthenium-containing gas supply time T1, after supplying the ruthenium-containing gas and the CO gas, the dilution gas and the carrier gas may be supplied by switching the valves. Specifically, the valve 51 is opened, and the valves 52 and 53 are closed. As a result, the CO gas from the carrier gas source 44 is supplied into the processing chamber 1c. In addition, the CO gas from the dilution gas source 62 is supplied into the processing chamber 1c. At the end timings of the ruthenium-containing gas supply time T1 and the CO gas supply time T2, the valves 48 and 65 are closed.

By performing the control in this manner, the interior of the pipe 41 becomes a CO gas atmosphere in the purge process illustrated in step S105. That is, the ruthenium-containing gas existing in the pipe 41 is purged. This makes it possible to prevent a ruthenium film from being formed inside the pipe 41.

Figure 6:
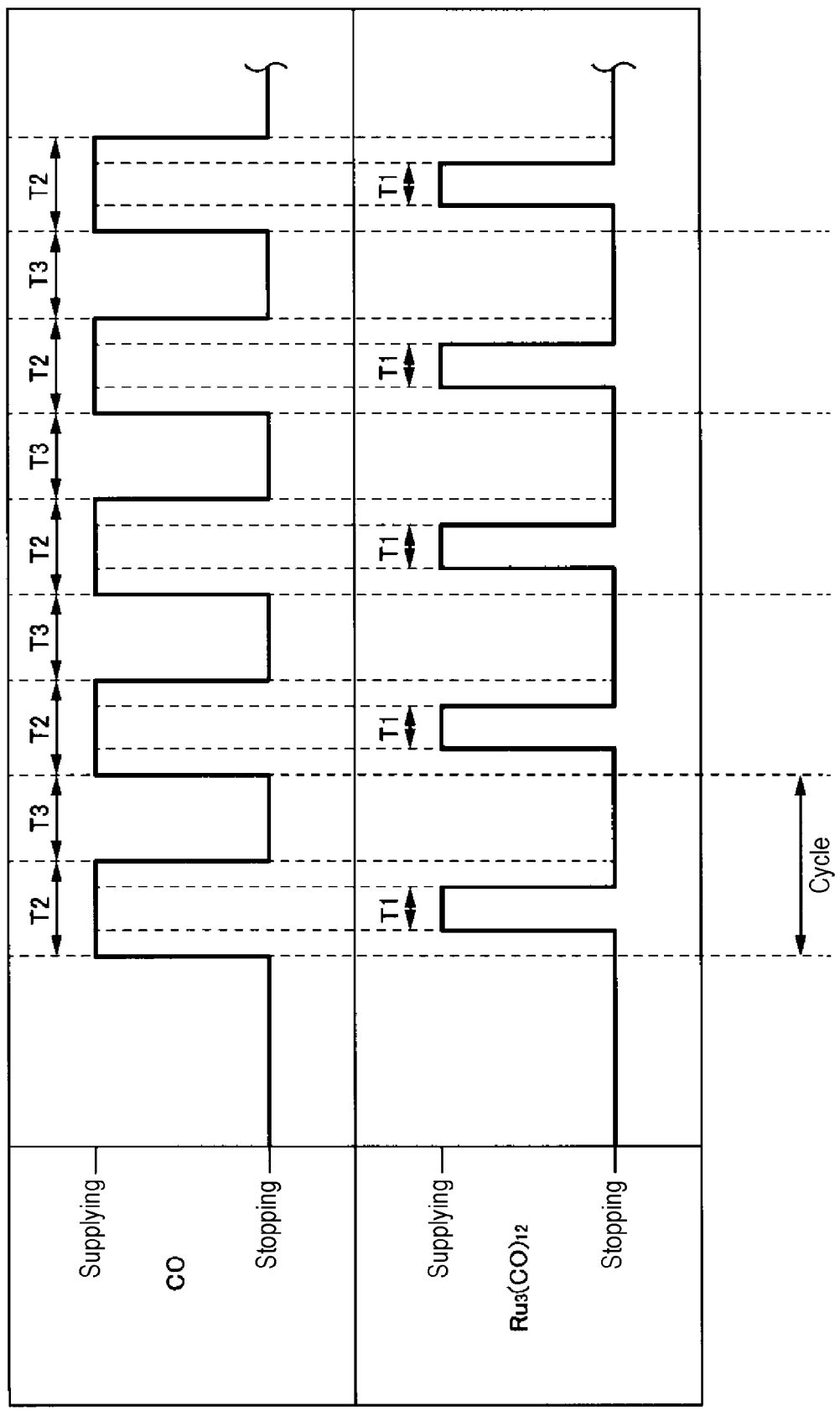
FIG. 6 is a timing chart explaining still another example of the supply and cutoff of a CO gas and a ruthenium-containing gas when a supply process and a purge process are repeatedly performed.

FIG. 6 is a timing chart explaining still another example of the supply and cutoff of the CO gas and the ruthenium-containing gas when the supply process and the purge process are repeatedly performed. In the example illustrated in FIG. 6, the CO gas supply time T2 is set to be longer than the ruthenium-containing gas supply time T1. Further, the start timing of the CO gas supply time T2 is set to be earlier than the start timing of the ruthenium-containing gas supply time T1. Further, the end timing of the CO gas supply time T2 is set to be later than the end timing of the ruthenium-containing gas supply time T1. Specifically, the valve 48 is opened after a predetermined time from the opening of the valve 65. In addition, the valve 65 is closed after a predetermined time from the closing of the valve 48.

Further, for example, at the start timing of the CO gas supply time T2, after supplying the dilution gas and the carrier gas, the ruthenium-containing gas may be supplied by switching the valves. In addition, at the end timing of the ruthenium-containing gas supply time T1, after supplying the ruthenium-containing gas and the CO gas, the dilution gas and the carrier gas may be supplied by switching the valves. Specifically, the valves 52 and 53 are closed and the valves 45, 51, and 48 are opened so as to supply the CO gas from the carrier gas source 44 into the processing chamber 1c. In addition, the valves 63 and 65 are opened so as to supply the CO gas from the dilution gas source 62 into the processing chamber 1c. At the start timing of the ruthenium-containing gas supply time T1, the valves 52 and 53 are opened, and the valve 51 is closed. At the end timing of the ruthenium-containing gas supply time T1, the valve 51 is opened, and the valves 52 and 53 are closed. As a result, the CO gas from the carrier gas source 44 is supplied into the processing chamber 1c. In addition, the CO gas from the dilution gas source 62 is supplied into the processing chamber 1c. At the end timings of the ruthenium-containing gas supply time T1 and the CO gas supply time T2, the valves 48 and 65 are closed.

By performing the control in this manner, it is possible to establish a CO gas atmosphere in the interior of the processing chamber 1c before the ruthenium-containing gas is supplied into the processing chamber 1c. Therefore, it is possible to suppress the growth of metal ruthenium nuclei on the substrate W and to form a dense ruthenium film having high smoothness. By performing the control in this manner, the interior of the pipe 41 becomes a CO gas atmosphere in the purge process illustrated in step S105. That is, the ruthenium-containing gas existing in the pipe 41 is purged. This makes it possible to prevent a ruthenium film from being formed inside the pipe 41.

Figure 7:
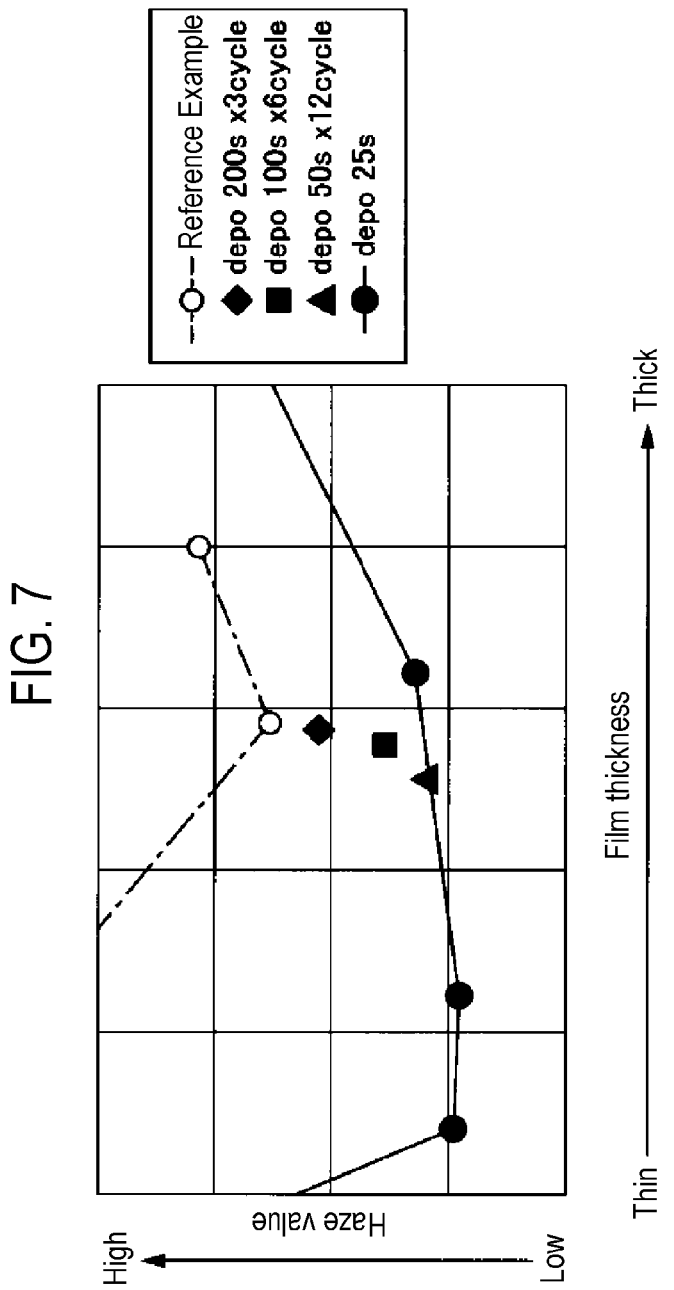
FIG. 7 is a graph showing an example of a relationship between a film thickness and a Haze value when the supply time of the ruthenium-containing gas is changed.

FIG. 7 is a graph showing an example of a relationship between a film thickness and a Haze value when the ruthenium-containing gas supply time T1 is changed. Here, film formation was performed under the process conditions below.

Wafer temperature: 130 to 250 degrees C.
Pressure: 5 to 200 mTorr
CO flow rate: 50 to 300 sccm
Gap between the stage and the gas ejection mechanism: 50 to 60 mm The relationship between the film thickness of the ruthenium film and the Haze value when the ruthenium-containing gas supply time T1 was set to 25 sec is shown by solid black circles and a solid line. Reference Example shows a case in which the ruthenium-containing gas and the CO gas were continuously supplied so as to form a ruthenium film on the substrate W. The relationship between the film thickness of the ruthenium film and the Haze value in Reference Example is shown by white circles and a dashed line.

As shown in FIG. 7, by forming the ruthenium film according to the flow illustrated in FIG. 2, the Haze value is reduced compared with Reference Example, that is, the smoothness of the ruthenium film is improved.

In FIG. 7, the relationship between the film thickness of the ruthenium film and the Haze value is shown in each of the case in which T1 was set to 50 sec and 12 cycles were performed, the case in which T1 was set to 100 sec and 6 cycles were performed, and the case in which T1 was set to 200 sec and 3 cycles were performed.

As shown in FIG. 7, as the ruthenium-containing gas supply time T1 shortens, the Haze value is reduced, that is, the smoothness of the ruthenium film is improved. In addition, the film-forming rate is reduced as the ruthenium-containing gas supply time T1 shortens.

Figure 8:
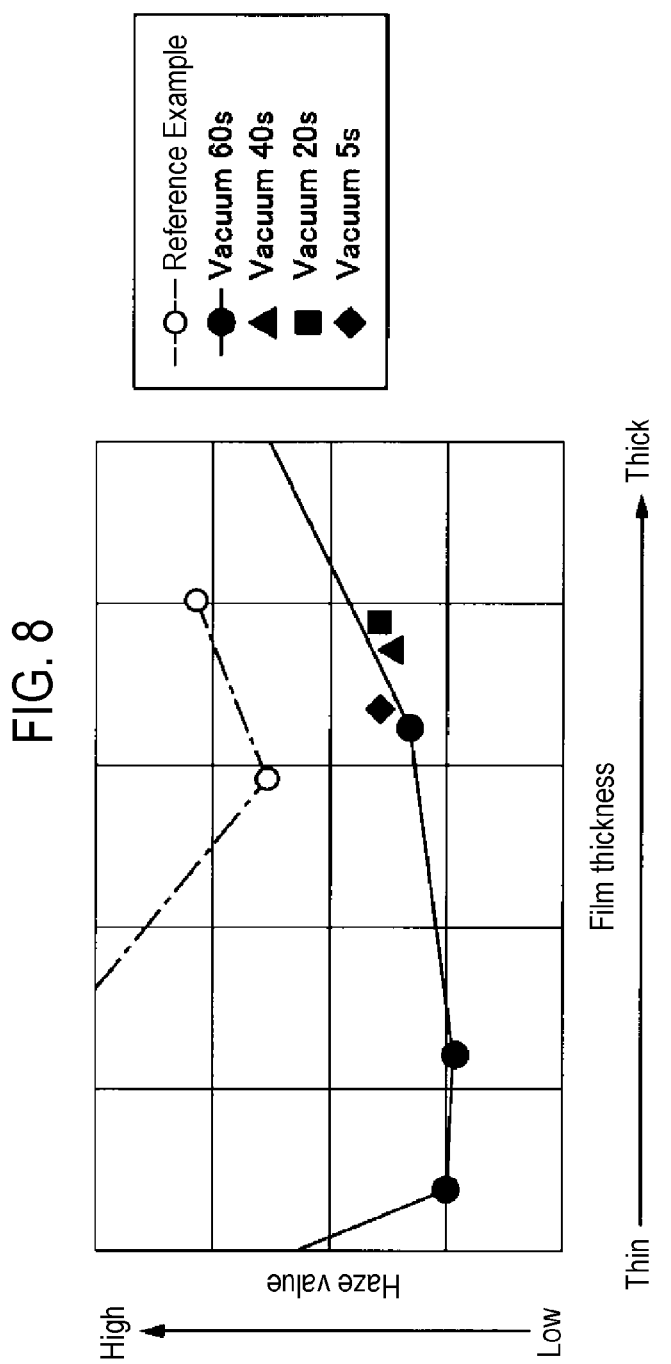
FIG. 8 is a graph showing an example of a relationship between a film thickness and a Haze value when a purge time is changed.

FIG. 8 is a graph showing an example of a relationship between a film thickness and a Haze value when a purge time T3 is changed. Here, film formation was performed under the process conditions below.

Wafer temperature: 130 to 250 degrees C.
Pressure: 5 to 200 mTorr
CO flow rate: 50 to 300 sccm Gap between stage and gas ejection mechanism: 50 to 60 mm The relationship between the film thickness of the ruthenium film and the Haze value when the purge time T3 was set to 60 sec is shown by solid black circles and a solid line. Reference Example shows a case in which the ruthenium-containing gas and the CO gas were continuously supplied so as to form a ruthenium film on the substrate W. The relationship between the film thickness of the ruthenium film and the Haze value in Reference Example is shown by white empty circles and a dashed line.

Further, FIG. 8 shows a relationship between the film thickness of the ruthenium film and the Haze value in each of a case in which the purge time T3 was set to 40 sec, a case in which the purge time T3 was set to 20 sec, and a case in which the purge time T3 was set to 5 sec.

As shown in FIG. 8, when the purge time T3 is 20 sec or longer, the Haze value is reduced, that is, the smoothness of the ruthenium film is improved. On the other hand, when the purge time T3 is set to 5 sec, the effect of reducing the Haze value decreases.

<Other Operations of Film Forming Apparatus>

Figure 9:
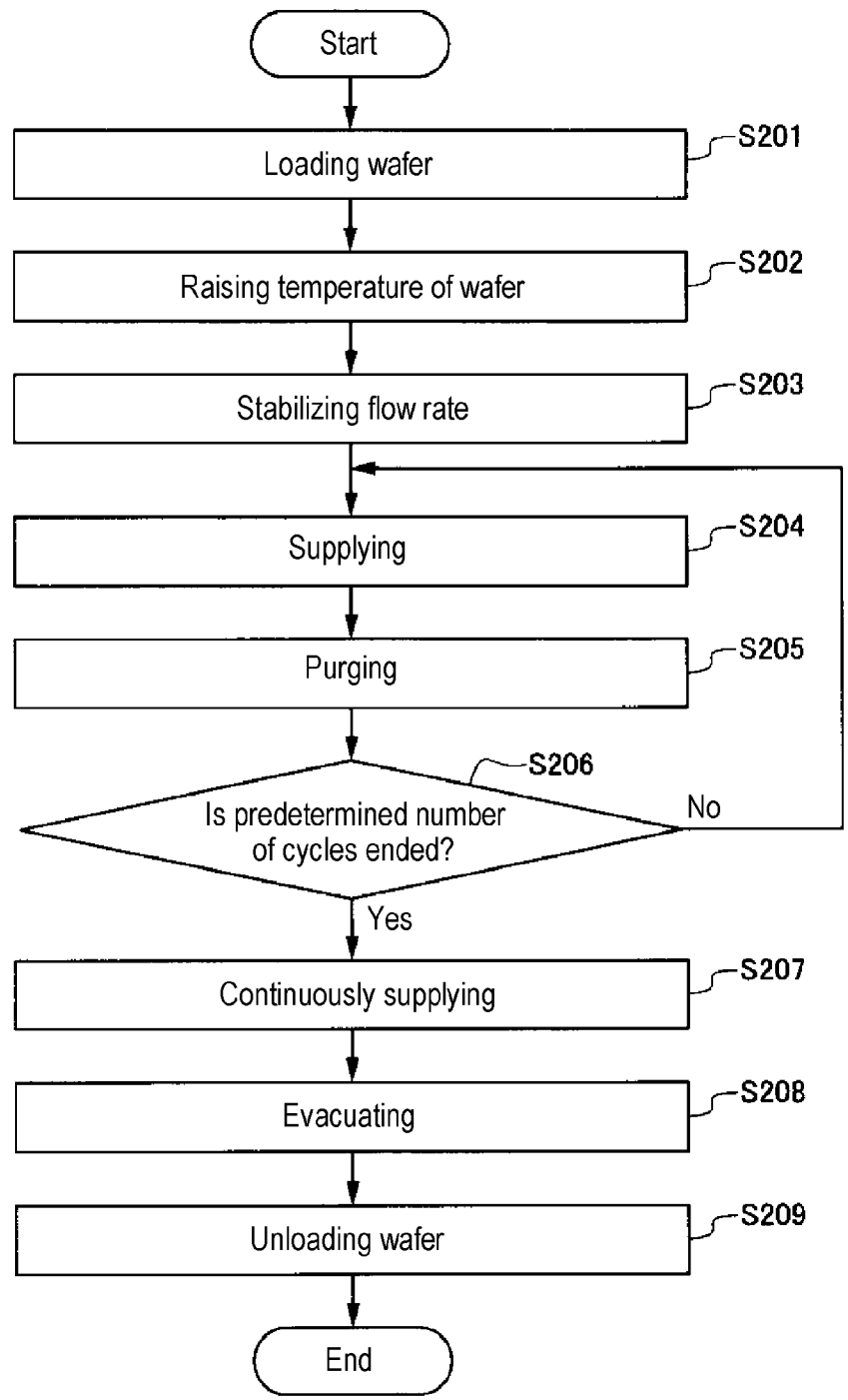
FIG. 9 is a flowchart illustrating another example of the operation of the film forming apparatus according to the embodiment.

Another example of the operation of the film forming apparatus 100 will be described with reference to FIG. 9. FIG. 9 is a flowchart illustrating another example of the operation of the film forming apparatus 100 according to the present embodiment. At the time of starting, the interior of the processing chamber 1c is kept in a vacuum atmosphere by the exhaust part 19. In addition, the stage 5 is moved to the delivery position.

In addition, in the flowchart illustrated in FIG. 9, processes in steps S201 to S206 are similar to those in steps S101 to S106 illustrated in FIG. 2, and thus, a redundant description thereof will be omitted. A predetermined number of cycles in step S206 may be smaller than the predetermined number of cycles in step S106. In addition, the predetermined number of cycles in step S206 may be set such that, for example, a dense ruthenium film (e.g., 1 to 4 nm) is formed on the surface of the substrate W.

In step S207, the controller 20 executes a continuous supply process of continuously supplying the ruthenium-containing gas and the CO gas into the processing chamber 1c. Specifically, the controller 20 closes the valve 51 and opens the valves 45, 52, 53, and 48. Further, the controller 20 opens the valves 63 and 65. As a result, predetermined processes such as film formation and the like are performed on the substrate W. The processing time of the continuous supply process is set such that, for example, the film thickness of the ruthenium film becomes a desired thickness.

Thereafter, processes in steps S208 and S209 are similar to those in steps S107 and S108 in FIG. 2, and thus, a redundant description thereof will be omitted.

Figure 10:
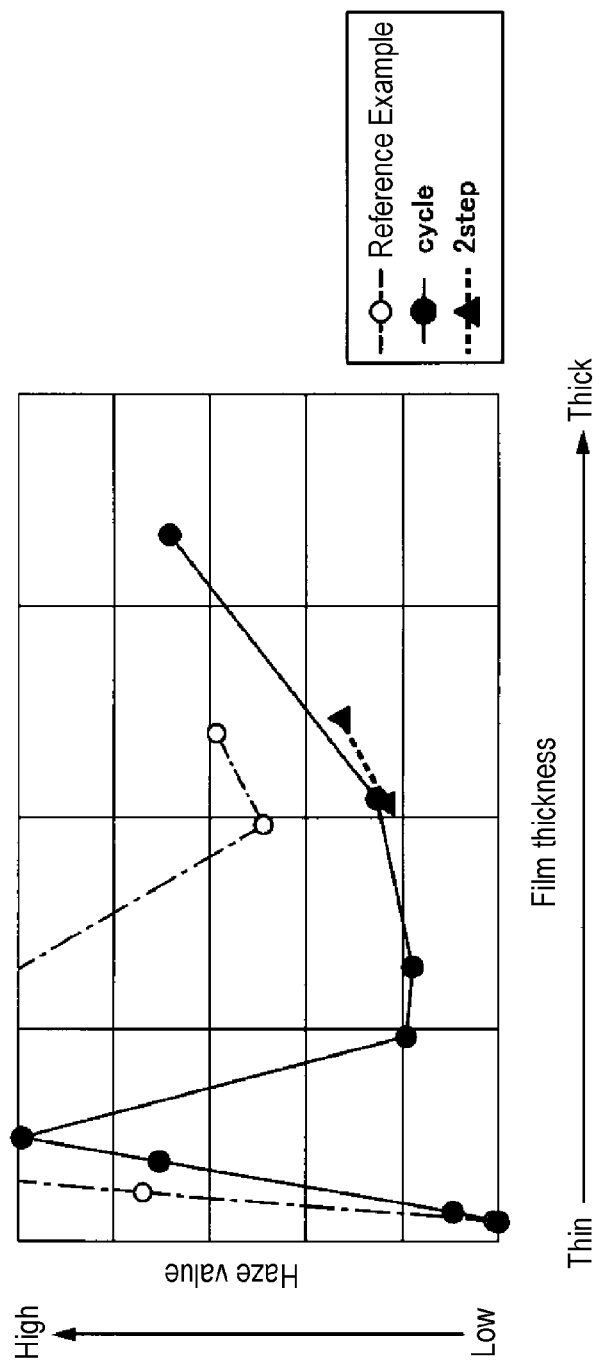
FIG. 10 is a graph showing an example of a relationship between a film thickness and a Haze value.

FIG. 10 is a graph representing an example of a relationship between a film thickness and a Haze value. Here, film formation was performed under the process conditions below.

Wafer temperature: 130 to 250 degrees C.
Pressure: 5 to 200 mTorr
CO flow rate: 50 to 300 sccm
Gap between the stage and the gas ejection mechanism: 50 to 60 mm The relationship between the film thickness of the ruthenium film and the Haze value in Reference Example is shown by white empty circles and a dashed line. Further, the relationship between the film thickness of the ruthenium film and the Haze value when the ruthenium film was formed through the cycle including the supply process and the purge process illustrated in FIG. 2 is shown by solid black circles and a solid line ("cycle"). Further, the relationship between the film thickness of the ruthenium film and the Haze value when the ruthenium film was formed through two steps of the cycle including the supply process and the purge process illustrated in FIG. 9 and the continuous supply process is shown by solid black triangles and a broken line ("2 step").

As shown in FIG. 10, even in the processes illustrated in FIG. 9, the same Haze value reduction effect as the processes illustrated in FIG. 2 was confirmed. In addition, the film-forming process by the processes illustrated in FIG. 9 can shorten the film-forming time compared with the film-forming process by the processes shown in FIG. 2.

According to an aspect, it is possible to provide a substrate processing method and a substrate processing apparatus that improve smoothness of a ruthenium film.

In the foregoing, the film-forming method according to the present embodiments using the film forming apparatus 100 has been described. However, the present disclosure is not limited to the above-described embodiments or the like. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
    placing a substrate on a stage provided inside a processing container; and
    forming a ruthenium film on the substrate,
    wherein forming the ruthenium film comprises repeating a cycle including:
        supplying a ruthenium-containing gas and a CO gas into the processing container; and
        stopping the supply of the ruthenium-containing gas and the CO gas into the processing container and exhausting a gas within the processing container, and
        after performing the repeating the cycle, continuously supplying the ruthenium-containing gas and the CO gas into the processing container, without performing evacuating, for a processing time set such that a thickness of the ruthenium film becomes a desired thickness,
    wherein, in the supplying the ruthenium-containing gas and the CO gas of the repeating the cycle, the CO gas is supplied before a timing of starting the supply of the ruthenium-containing gas,
    wherein, in the repeating the cycle, a supply time of the ruthenium-containing gas is 25 sec or more and 200 sec or less or a purge time of the exhausting the gas within the processing container is 5 sec or more and 60 sec or less, so as to increase smoothness of the ruthenium film,
    wherein, in the forming the ruthenium film, a temperature of the substrate is 130 to 250 degrees C., a pressure is 5 to 200 mTorr, a flow rate of the CO gas is 50 to 300 sccm, and a gap between the stage and a gas ejection mechanism is 50 to 60 mm, and
    wherein the ruthenium-containing gas is $Ru_3(CO)_{12}$.

2. The substrate processing method of claim 1, wherein, in the supplying the ruthenium-containing gas and the CO gas of the repeating the cycle, the supply of the CO gas is stopped after a timing of stopping the supply of the ruthenium-containing gas.

\* \* \* \* \*